(12) United States Patent
Zhu et al.

(10) Patent No.: US 7,691,482 B2
(45) Date of Patent: Apr. 6, 2010

(54) STRUCTURE FOR PLANAR SOI SUBSTRATE WITH MULTIPLE ORIENTATIONS

(75) Inventors: Huilong Zhu, Poughkeepsie, NY (US); Bruce B. Doris, Brewster, NY (US); Meikei Ieong, Wappingers Falls, NY (US); Philip J. Oldiges, Lagrangeville, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 11/473,835

(22) Filed: Jun. 23, 2006

(65) Prior Publication Data

US 2006/0237790 A1    Oct. 26, 2006

Related U.S. Application Data

(62) Division of application No. 10/710,277, filed on Jun. 30, 2004, now Pat. No. 7,094,634.

(51) Int. Cl.
*B32B 9/04* (2006.01)
*H01L 27/12* (2006.01)

(52) U.S. Cl. .......... 428/446; 428/221; 428/222; 428/448; 257/347; 257/369; 438/198; 438/285; 438/150

(58) Field of Classification Search ......... 428/221, 428/222, 446, 448; 257/347, 369; 438/150, 438/198, 285
See application file for complete search history.

(56) References Cited

U.S. PATENT DOCUMENTS

| | | | |
|---|---|---|---|
| 5,384,473 A * | 1/1995 | Yoshikawa et al. .......... 257/255 |
| 5,882,987 A | 3/1999 | Srikrishnan | |
| 5,920,764 A | 7/1999 | Hanson et al. | |
| 6,821,826 B1 * | 11/2004 | Chan et al. .................. 438/150 |
| 6,830,962 B1 | 12/2004 | Guarini et al. | |
| 6,835,981 B2 | 12/2004 | Yamada et al. | |
| 6,884,693 B2 | 4/2005 | Yi | |
| 6,902,962 B2 * | 6/2005 | Yeo et al. .................... 438/150 |
| 6,949,420 B1 | 9/2005 | Yamashita | |
| 6,998,684 B2 | 2/2006 | Anderson et al. | |
| 2004/0195646 A1 | 10/2004 | Yeo et al. | |

* cited by examiner

*Primary Examiner*—David R Sample
*Assistant Examiner*—Lawrence D Ferguson
(74) *Attorney, Agent, or Firm*—Scully, Scott, Murphy & Presser, P.C.; Joseph P. Abate, Esq.

(57) ABSTRACT

The present invention provides a method of forming a substantially planar SOI substrate having multiple crystallographic orientations including the steps of providing a multiple orientation surface atop a single orientation layer, the multiple orientation surface comprising a first device region contacting and having a same crystal orientation as the single orientation layer, and a second device region separated from the first device region and the single orientation layer by an insulating material, wherein the first device region and the second device region have different crystal orientations; producing a damaged interface in the single orientation layer; bonding a wafer to the multiple orientation surface; separating the single orientation layer at the damaged interface; wherein a damaged surface of said single orientation layer remains; and planarizing the damaged surface until a surface of the first device region is substantially coplanar to a surface of the second device region.

7 Claims, 6 Drawing Sheets

STRUCTURE FOR PLANAR SOI SUBSTRATE WITH MULTIPLE ORIENTATIONS

CROSS REFERENCE TO RELATED APPLICATION

This application is a divisional of U.S. application Ser. No. 10/710,277, filed Jun. 30, 2004 now U.S. Pat. No. 7,094,634.

This application is related to co-pending and co-assigned U.S. patent application Ser. No. 10/250,241 entitled HIGH PERFORMANCE SOI DEVICES ON HYBRID CRYSTAL-ORIENTATED SUBSTRATES, filed Jun. 17, 2003, the entire content and subject matter of which are incorporated herein by reference.

FIELD OF THE INVENTION

The present invention relates to semiconductor devices. In particular, the present invention provides a means for integrating at least two types of semiconductor devices, such as nFETs and pFETs, onto a planar silicon-on-insulator (SOI) substrate having different crystallographic orientations. The location of each device on the planar SOI substrate is dependent upon the performance that the device has on a particular crystal orientation.

BACKGROUND OF THE INVENTION

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. A concise summary of near-term and long-term challenges to continued CMOS scaling can be found in the "Grand Challenges" section of the 2002 Update of the International Technology Roadmap for Semiconductors (ITRS). A very thorough review of the device, material, circuit, and systems can be found in Proc. IEEE, Vol. 89, No. 3, March 2001, a special issue dedicated to the limits of semiconductor technology.

Since it has become increasingly difficult to improve MOSFETs and therefore complementary metal oxide semiconductor (CMOS) performance through continued scaling, methods for improving performance without scaling have become critical. One approach for doing this is to increase carrier (electron and/or hole) mobilities. Increased carrier mobility can be obtained, for example, by building MOSFETS on Si surfaces that are orientated in directions different than conventional (100) Si. For example, the (100) crystal surface provides n-type field effect transistors (nFETs) with high performance, while the (110) crystal surface provides p-type field effect transistors (pFETs) with high performance.

Electrons are known to have a high mobility for a (100) Si surface orientation, but holes are known to have high mobility for a (110) surface orientation. That is, hole mobility values on (100) Si are roughly 2×-4× lower than the corresponding electron hole mobility for this crystallographic orientation. To compensate for this discrepancy, pFETs are typically designed with larger widths in order to balance pull-up currents against the nFET pull-down currents and achieve uniform circuit switching. PFETs having larger widths are undesirable since they take up a significant amount of chip area.

On the other hand, hole mobilities on (110) Si are approximately 2× higher than on (100) Si; therefore, pFETs formed on a (110) surface will exhibit significantly higher drive currents than pFETs formed on a (100) surface. Unfortunately, electron mobilities on (110) Si surfaces are significantly degraded compared to (100) Si surfaces.

Prior attempts to provide substrates having multiple orientations have not provided planar silicon-on-insulator (SOI) substrates for both nFET and pFET devices. SOI substrates are advantageous over bulk-Si substrates, since SOI substrates reduce parasitic capacitance within the integrated circuit and reduce individual circuit loads, thereby improving circuit and chip performance.

In view of the above, there is a need for providing integrated semiconductor devices that are formed upon a planar SOI substrate having different crystal orientations that provide optimal performance for a specific device. That is, there is an overwhelming need to create a planar SOI substrate which allows one type of device, such as, for example, a pFET, to be formed on a certain crystallographic surface, e.g., a (110) surface, while forming another type of device, such as, for example, an nFET, on another crystallographic surface, e.g., a (100) surface.

SUMMARY OF THE INVENTION

One object of the present invention is to provide a structure and method for manufacturing substantially planar SOI substrates with multiple crystallographic orientations.

Another object of the present invention is to provide a method of integrating semiconductor devices such that different types of devices are formed upon a specific crystal orientation of a substantially planar SOI substrate that enhances the performance of the device.

A further object of the present invention is to provide a method of integrating semiconductor devices such that the pFETs are located on a (110) crystallographic plane, while the nFETs are located on a (100) crystallographic plane of an SOI substrate.

These and other objects and advantages are achieved by utilizing a method that includes the steps of wafer bonding, masking, etching, regrowth, and planarization processes. Specifically, the method of the present invention comprises the steps of:

providing a multiple orientation surface atop a single orientation layer, the multiple orientation surface comprising a first device region contacting and having the same crystal orientation as the single orientation layer, and a second device region separated from the first device region and the single orientation layer by an insulating material, wherein the first device region and the second device region have different crystal orientations;

forming a damaged interface in the single orientation layer;

bonding a wafer to the multiple orientation surface;

separating the single orientation layer at the damaged interface, wherein a damaged surface of the single orientation layer remains; and planarizing the damaged surface until a surface of the first device region is substantially coplanar to a surface of the second device region.

In accordance with the present invention, the initial structure having a multiple orientation surface atop a single orientation layer may be provided by a wafer bonding process.

First, a semiconductor layer is bonded to the single orientation layer, in which an insulating layer separates the first semiconducting layer from the single orientation layer. The semiconductor layer and the single orientation layer have different crystallographic orientations. In a next process step, a portion of the semiconducting layer is defined to form the second device region, in which the second device region has the same crystallographic orientation of the semiconductor layer. The second device region is defined by forming a block mask protecting a portion of the first semiconducting layer, while leaving another portion of the bonded substrate unprotected. The unprotected portion of the semiconducting layer is then etched to expose a surface of the single orientation layer. An insulating material is then formed around the second device region. The second device region can further include a planarization stop layer positioned between the semiconductor layer and the insulating layer.

An epitaxially grown semiconductor material is then formed on the exposed surface of the single orientation layer to produce a first device region having the same crystal orientation as the single orientation layer. The first device region has a crystal orientation that is different from the second device region. The exposed surfaces of the first device region and the second device region are then planarized to be substantially coplanar, hence providing the multiple orientation surface atop the single orientation layer.

A damaged interface in then formed in the single orientation layer by ion implanting hydrogen atoms. Following the formation of the damaged interface, a planarized bonding layer is formed atop the multiple orientation layer, in which the planarized bonding layer is then contacted by a wafer under conditions that are capable of bonding the wafer to the planarized bonding layer. The single orientation layer is then split along the damaged interface. A separated portion of the single orientation layer is discarded exposing a damaged surface of a remaining single orientation layer.

The damaged surface of the remaining single orientation structure is then planarized using chemical mechanical polishing (CMP), or like process. The planarization process continues through the remaining portion of the single orientation layer stopping on the planarization stop layer of the second device region. A thermal oxide layer is then formed on the second device region so that the thermal oxide layer is substantially coplanar with the planarization stop layer. The planarization stop layer and the thermal oxide layer are then removed by a selective etch process.

The first device region may be further processed to include at least one pFET device, in which the crystallographic orientation of the first device region is preferably a (110) crystal plane. The second device region may be further processed to include at least one nFET device, in which the crystallographic orientation of the second device region is preferably a (100) crystal plane.

Another aspect of the present invention relates to a substantially planar multiple crystallographic orientation SOI substrate produced by the above method. Specifically, the structure of the present invention comprises:

a substantially planar SOI substrate comprising a first device region having a first crystallographic orientation and a second device region having a second crystallographic orientation, the first crystallographic orientation being different from the second crystallographic orientation; and an insulating material separating the first device region from the second device region.

DETAILED DESCRIPTION OF THE INVENTION

Figure 1:
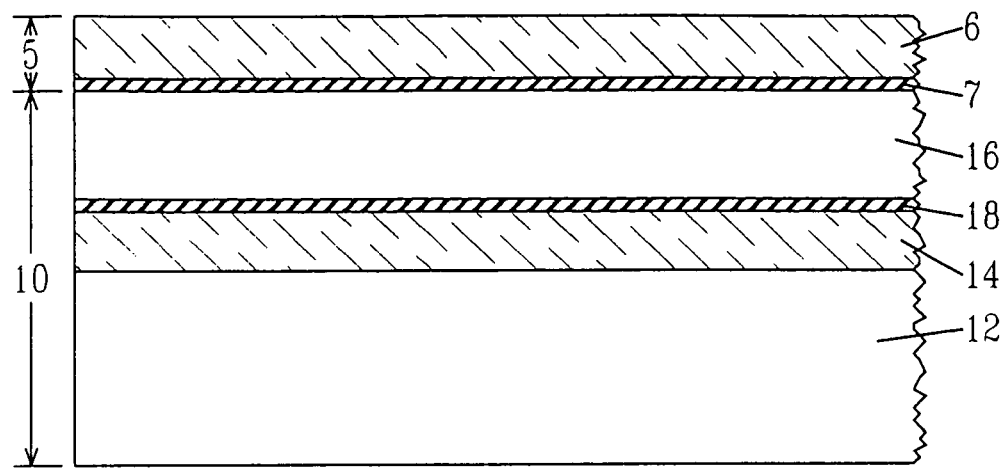
FIGS. 1-11 are pictorial representations (through cross sectional views) illustrating the basic processing steps utilized in the present invention in forming a substantially planar SOI substrate having multiple crystallographic orientation planes.

The present invention, which provides a method of forming a substantially planar SOI substrate having different crystallographic surfaces, will now be described in greater detail by referring to the following discussion as well as the drawings that accompany the present application. In the accompanying drawings, like and correspondence elements are referred to by like reference numerals.

Reference is first made to the initial structure shown in FIG. 1, in which a bonded substrate 10, i.e., hybrid substrate, is provided that may be employed in the present invention. As shown, bonded substrate 10 includes a first semiconductor layer 16, a first planarization stop layer 18, a first insulating layer 14, and a second semiconductor layer 12.

The first semiconductor layer 16 is comprised of any semiconducting material including, for example, Si, SiC, SiGe, SiGeC, Ge alloys, GaAs, InAs, InP as well as other III/V or II/VI compound semiconductors. First semiconductor layer 16 may also comprise an SOI layer of a preformed SOI substrate or a layered semiconductor such as, for example, Si/SiGe. The first semiconductor layer 16 has a first crystallographic orientation, which is preferably a (100) crystal plane. Although a (100) crystal plane is preferred, the first semiconductor layer 16 may alternatively be in a (111), (110) or other crystal plane.

The thickness of the first semiconductor layer 16 may vary depending on the initial starting wafers used to form the bonded substrate 10. Typically, however, the first semiconductor layer 16 has a thickness from about 5 nm to about 500 nm, with a thickness from about 5 nm to about 100 nm being more highly preferred.

The first insulating layer 14 which is located between the first semiconductor layer 16 and the planarization stop layer 18 has a variable thickness depending upon the initial wafers used to create the bonded substrate 10. Typically, however, the first insulating layer 14 has a thickness from about 10 nm to about 500 nm, with a thickness from about 20 nm to about 100 nm being more highly preferred. The insulating layer 14 is an oxide or other like insulator material, preferably being $SiO_2$.

The planarization stop layer 18 which is located between the first insulating layer 14 and the first semiconductor layer 16 has a thickness ranging from about 5 nm to about 20 nm, with a thickness of about 10 nm being highly preferred. The planarization stop layer 18 is a nitride or oxynitride material, preferably being $Si_3N_4$.

The second semiconductor layer 12 is comprised of any semiconducting material which may be the same or different from that of the first semiconductor layer 16. Thus, second semiconductor layer 12 may include, for example, Si, SiC, SiGe, SiGeC, Ge alloys, GaAs, InAs, InP as well as other III/V or II/VI compound semiconductors. Second semiconductor layer 12 may also comprise an SOI layer of a preformed SOI substrate or a layered semiconductor such as, for example, Si/SiGe. The second semiconductor layer 12 has a second crystallographic orientation, which is different from the first crystallographic orientation. Since the first semiconductor layer 16 is preferably a (100) surface, the crystallographic orientation of the second semiconductor layer 12 is preferably (110). Although a (110) crystal plane is preferred, the second semiconductor layer 12 may alternatively be in a (111), (100) or other crystal plane.

The bonded substrate 10 can be formed by thermally bonding the first semiconductor layer 16 and the second semiconductor layer 12 through insulating layers positioned there between, such as the first planarization stop layer 18 and the first insulating layer 14. For example, the first planarization stop layer 18 is deposited on the first semiconductor layer 16 and the insulating layer 14 is deposited on the second semiconductor layer 12. The first planarization stop layer 18 is then contacted with the first insulating layer 14 under thermal conditions sufficient to create bonding between the first planarization stop layer 18 and the insulating layer 14. During the thermal bonding process, the first semiconductor layer 16 and the second semiconductor layer 12 may be supported by handling wafers that are discarded following bonding.

Still referring to FIG. 1, a dielectric stack 5 is then formed atop the first semiconductor layer 16. The dielectric stack 5 includes at least a second insulating layer 6 and a second planarization stop layer 7 and can be formed using deposition processes.

The second insulating layer 6 may comprise an oxide, nitride, oxynitride or other insulating material, preferably being $SiO_2$, and may be formed using deposition processes, such as chemical vapor deposition. The second insulating layer 6 can have a thickness from about 10 nm to about 500 nm, with a thickness from about 20 nm to about 100 nm being more highly preferred.

The second planarization stop layer 7 is a nitride or oxynitride material, preferably being $Si_3N_4$, and can be formed using conventional deposition processes, such as chemical vapor deposition. The second planarization stop layer 7 can have a thickness ranging from about 5 nm to about 15 nm, with a thickness of about 10 nm being highly preferred.

Figure 2:
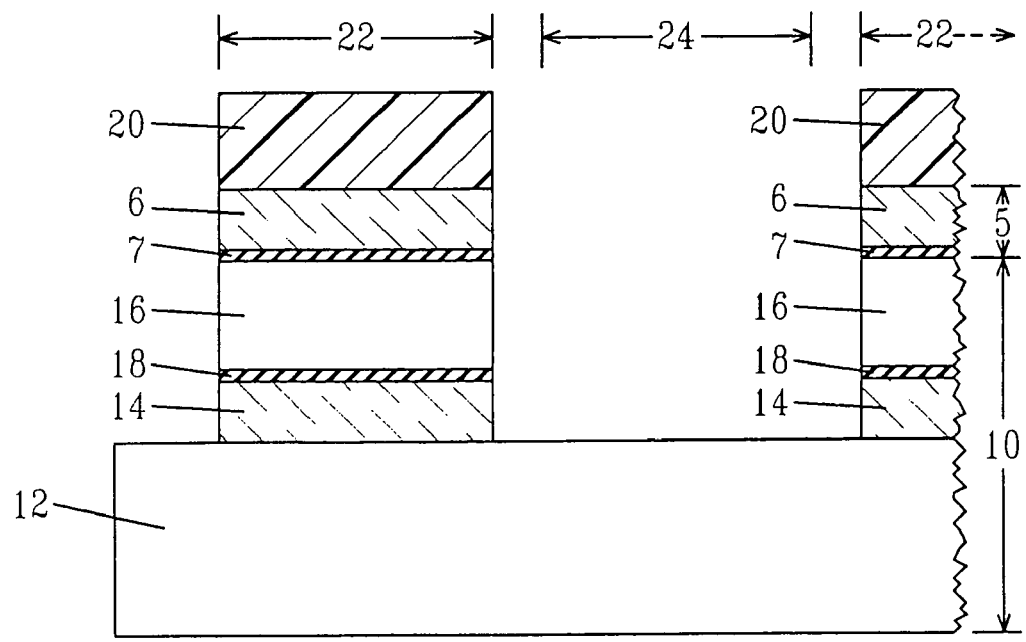

Referring to FIG. 2, following the formation of the dielectric stack 5, a mask 20 is formed on a predetermined portion of the second insulating layer 6, so as to protect a portion of the dielectric stack 5 and the underlying bonding substrate 10, while leaving another portion of the dielectric stack 5 and the bonded substrate 10 unprotected. The unprotected portion of the bonded substrate 10 defines a first device area 24 of the structure, whereas the protected portion of the bonded substrate 10 defines a second device region 22. In one embodiment, mask 20 is formed on a predetermined portion of the second insulating layer 6 by applying a photoresist layer to the entire surface of the bonded substrate 10. After application of the photoresist layer, the mask 20 is patterned by lithography, which includes the steps of exposing the photoresist to a pattern of radiation and developing the pattern utilizing a resist developer.

After providing the mask 20, the structure is subjected to one or more etching steps so as to expose a surface of the second semiconductor layer 12. Specifically, the one or more etching steps used at this point of the present invention removes the unprotected portions of the second insulating layer 6, the second planarization layer 7, the first semiconductor layer 16, and the first insulating layer 14, stopping on the second semiconducting layer 12. The etching used at this point of the present invention may include a dry etching process, such as reactive-ion etching, ion beam etching, plasma etching or laser etching. In a preferred embodiment of the present invention, reactive-ion etching (RIE) is used in selectively removing the unprotected portions of the second planarization stop layer 7, the second insulating layer 16, the first semiconductor layer 16, and the first insulating layer 14 without substantially etching the second semiconductor layer 12. The resultant structure after the etching process has been performed is shown, for example, in FIG. 2.

Figure 3:
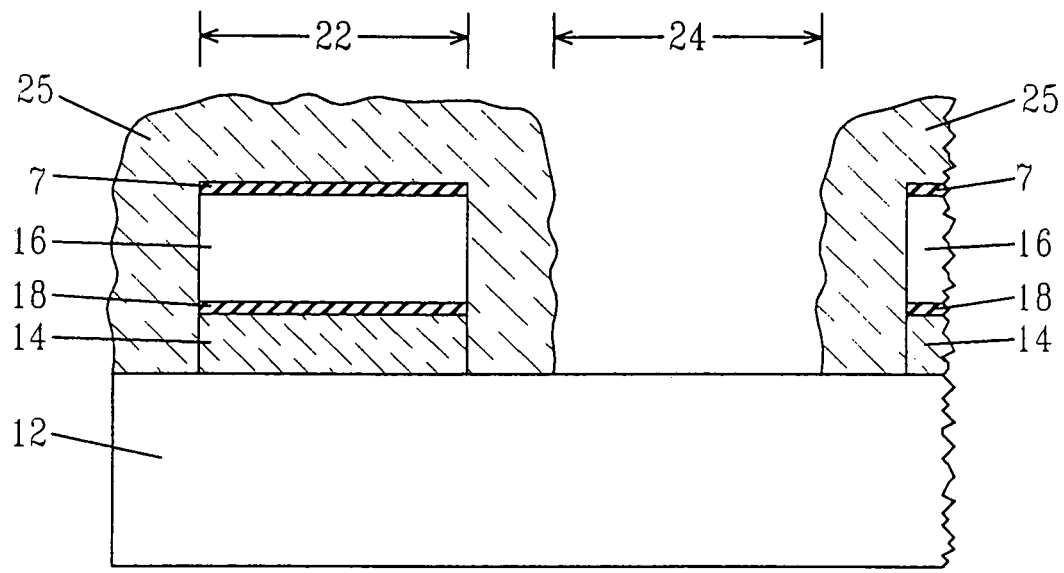

Referring to FIG. 3, the mask 20 is then removed utilizing a conventional resist stripping process. Following the removal of the mask 20, an insulating spacer 25 is formed on the exposed sidewalls of the remaining portions of the second planarization stop layer 7, the first semiconductor layer 16, the second planarization stop layer 18 and the first insulating layer 14 in the second device region 22. The insulating material 25 is formed by deposition and etching and can be comprised of any insulator, such as an oxide.

Figure 4:
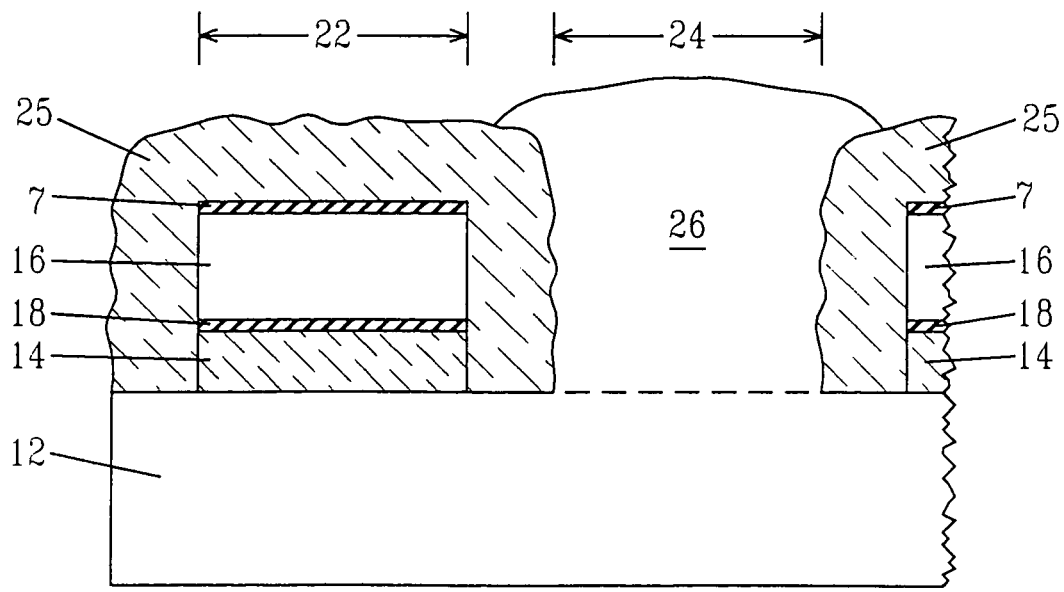

Referring to FIG. 4, a semiconductor material 26 is then epitaxially grown in the first device region 24, on the exposed surface of the second semiconductor layer 12. In accordance with the present invention, semiconductor material 26 has a crystallographic orientation that is the same as the crystallographic orientation of the second semiconductor layer 12. Preferably, the crystal plane of the semiconductor material 26 is (110). Although a (110) crystal plane is preferred, the semiconductor material 26 may alternatively have (111), (100) or crystal planes.

The semiconductor material 26 may comprise any Si-containing semiconductor, such as Si, strained Si, SiGe, SiC, SiGeC or combinations thereof, which is capable of being formed utilizing a selective epitaxial growth method. In some preferred embodiments, semiconductor material 26 is comprised of Si. In the present invention, semiconductor material 26 may be referred to as a regrown semiconductor material 26.

Figure 5:
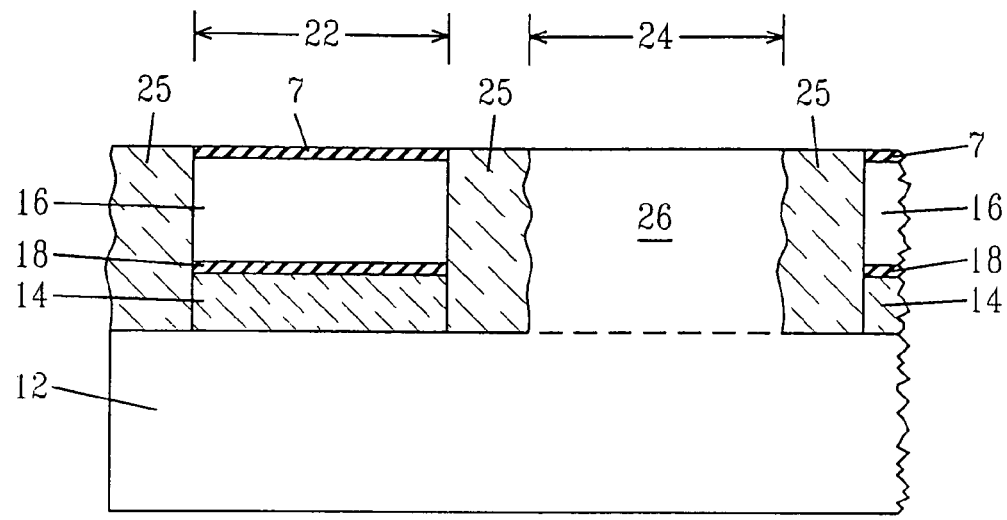

Next, the structure shown in FIG. 4 is subjected to a planarization process such as chemical mechanical polishing (CMP) or grinding such that the upper surface of the regrown semiconductor material 26 is substantially planar with the upper surface of the second planarization stop layer 7, as depicted in FIG. 5.

Figure 6:
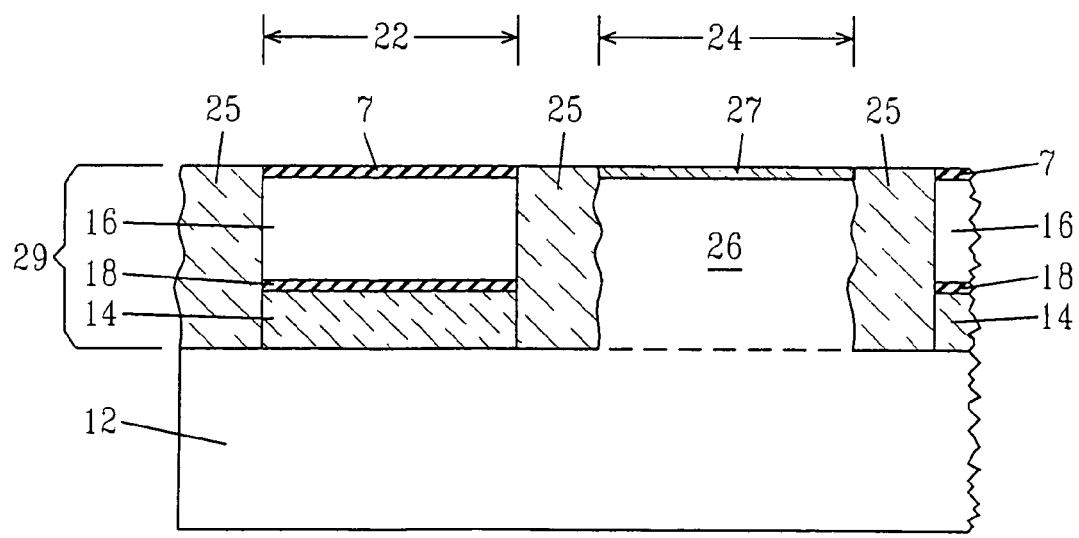

Referring to FIG. 6, a first thermal oxide layer 27 is then formed atop the semiconductor material 26 so that the first device region 24 has a surface substantially coplanar to the first semiconductor layer 16. The first thermal oxide layer 27 is formed by thermal oxidation of Si and can have a thickness ranging from about 10 nm to about 15 nm, so long as the top surface of the first thermal oxide layer 27 is substantially coplanar to the top surface of the second planarization stop layer 7. Preferably, the first thermal oxide layer 27 is $SiO_2$.

Following oxidation, the resultant structure comprises a substantially planar multiple orientation surface 29 atop the second semiconductor layer 12, as depicted in FIG. 6. The substantially planar multiple orientation surface 29 comprises the first device region 24 and the second device region 22, where the first device region 24 and the second device region 22 are separated by insulating material 25. As discussed above, the first device region 24 and the second device region 22 have different crystallographic orientations. The second semiconductor layer 12 has a single crystal orientation and is hereafter referred to as a single orientation layer 12.

Figure 7:
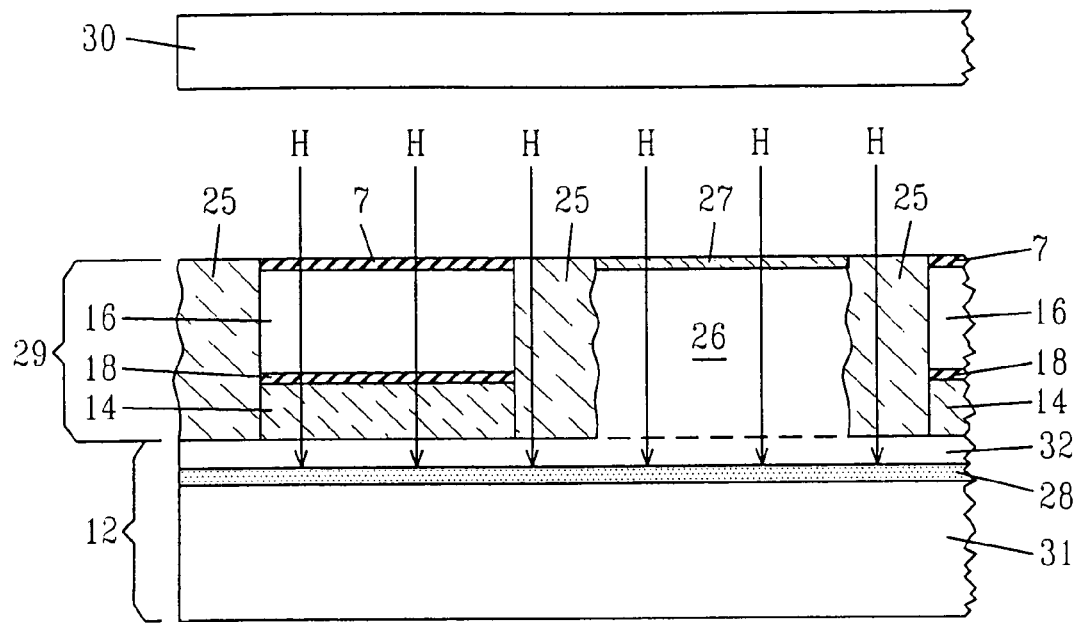

Referring to FIG. 7, in a next process step a damage interface 28 is formed within the single orientation layer 12 by implanting hydrogen ions, or other like ions, into the single orientation layer 12. The hydrogen ions may be implanted by conventional ion implantation using a dosage ranging from about $1 \times 10^{16}$ atoms/cm$^2$ to about $2 \times 10^{17}$ atoms/cm$^2$. The hydrogen atoms may be implanted using an implantation energy ranging from about 50 keV to about 150 keV.

Following the formation of the damaged interface 28, the face of the multiple orientation surface 29 is processed to provide a planar surface for wafer bonding. Prior to bonding, the first planarization stop layer 7 can be removed using an etch process having a high selectivity for removing the first planarization layer 7 without substantially etching the first semiconductor layer 6, insulating material 25, and first thermal oxide layer 27.

A planar bonding layer 33, comprising an insulating layer, is then formed using deposition and planarization processes. Specifically, an insulating layer is formed atop the exposed surface of the first semiconducting layer 16, the first thermal oxide layer 27, and the insulating material 25 using conventional deposition processes, such as chemical vapor deposition. The insulating layer is then planarized to produce the planar bonding layer 33 using conventional planarization methods, such as CMP. Preferably, the planar bonding layer 33 is an oxide having a thickness ranging from about 100 nm to about 200 nm, most preferably being $SiO_2$ having a thickness of 150 nm.

A wafer 30 is then bonded to the planar bonding layer 33. Bonding is achieved by first bringing the wafer 30 into intimate contact with the face of the planar bonding layer 33; optionally applying an external force to the contacted wafer 30 and planar bonding layer 33; and then heating the two contacted surfaces under conditions that are capable of bonding. The heating step may be performed in the presence or absence of an external force. The heating step is typically performed in an inert ambient at a temperature from about 200° to about 1050° C. for a time period from about 2 hours to about 20 hours. More preferably, the bonding is performed at a temperature from about 200° to about 400° C. for a time period from about 2 to about 20 hours. The term "inert ambient" is used in the present invention to denote an atmosphere in which an inert gas, such as He, Ar, $N_2$, Xe, Kr or a mixture thereof, is employed. A preferred ambient used during the bonding process is $N_2$.

Figure 8:
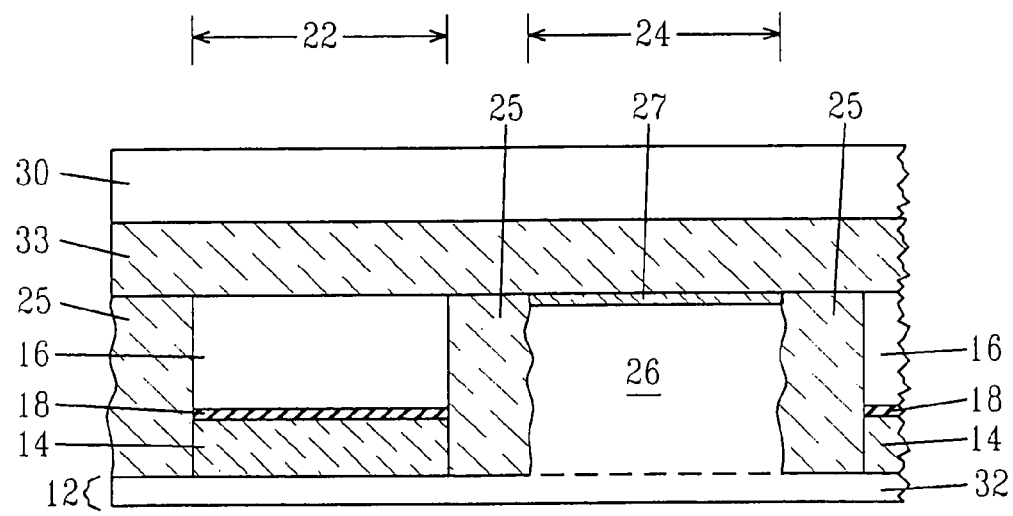

During bonding, the single orientation layer 12 is then separated about the damaged interface 28 of the single orientation layer 12, in which a portion 31 of the single orientation layer 12 positioned below the implanted ion region 28 is removed and a portion 33 of the single orientation layer 12 above the damaged interface remains, as depicted in FIG. 8.

Figure 9:
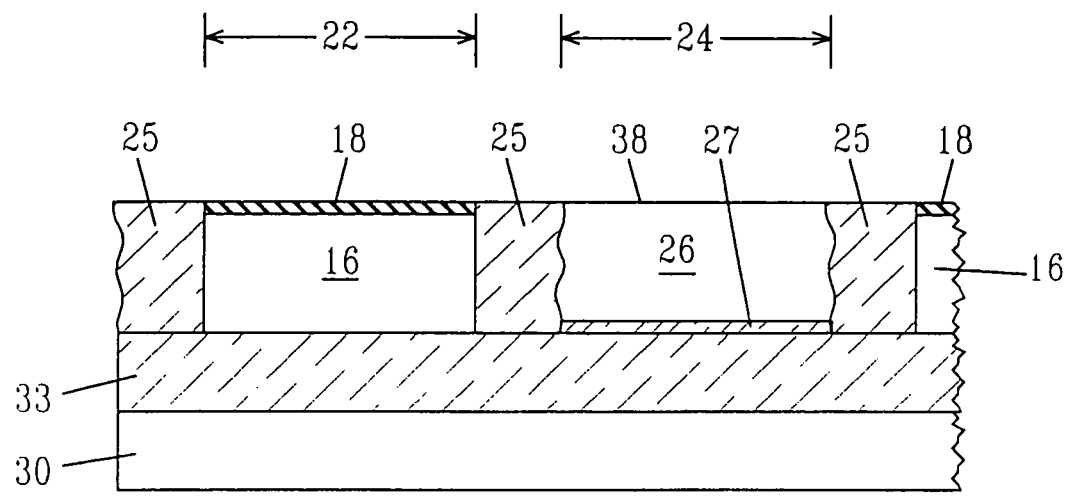

Referring to FIG. 9, the remaining portion 32 of the single orientation layer 12 is then subjected to a planarization process, such as chemical mechanical polishing (CMP) or grinding. The planarization process removes the remaining portion 32 of the single orientation layer 12, the first insulating layer 14, a portion of the insulating material 25, and a portion of the regrown semiconducting material 26. The planarization process ends on the first planarization stop layer 18 and exposes a surface 38 of the regrown semiconducting material 26.

Figure 10:
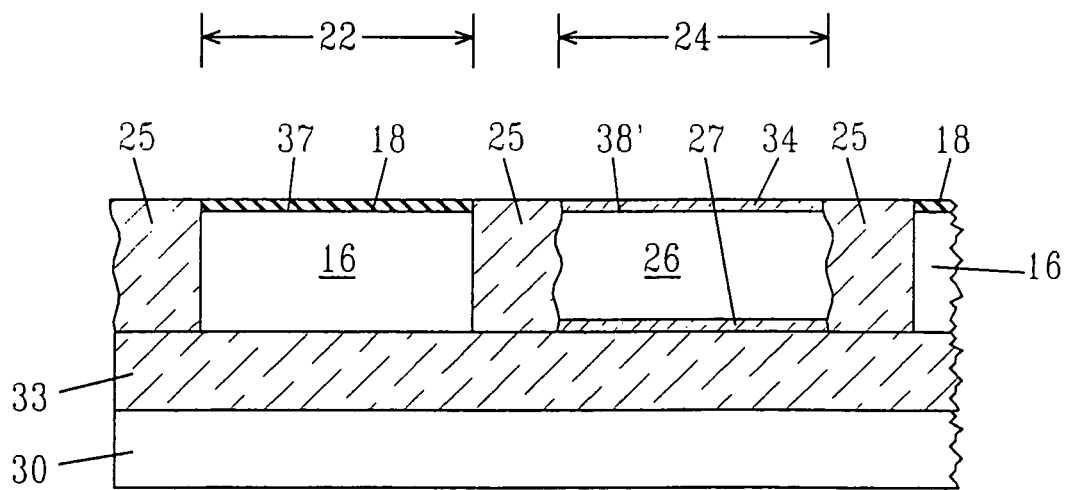

Referring to FIG. 10, in a next process step a second thermal oxide layer 34 is formed atop the exposed surface 38 of the regrown semiconducting material 26, so that the regrown semiconducting material 26 in the first device region 24 has a surface coplanar to the first semiconductor layer 6 in the second device region 22. The second thermal oxide layer 34 is formed by a thermal oxidation of Si. The second thermal oxidation consumes Si from the exposed surface 38 of the regrown semiconducting material 26, therefore leveling the upper surface 38 of the regrown semiconducting 38' material 26 in the first device region 24 to the upper surface 37 of the first semiconductor layer 16 in the second device region 22. The second thermal oxide layer 34 can have a thickness ranging from about 10 nm to about 15 nm, so long as the top surface 38' of the regrown semiconducting material 26 is substantially coplanar to the top surface 37 of the first semiconductor layer 16. The thickness of the regrown semiconducting material 26 can be different from the first semiconductor layer 16. Preferably, the second thermal oxide layer 34 is $SiO_2$.

Figure 11:
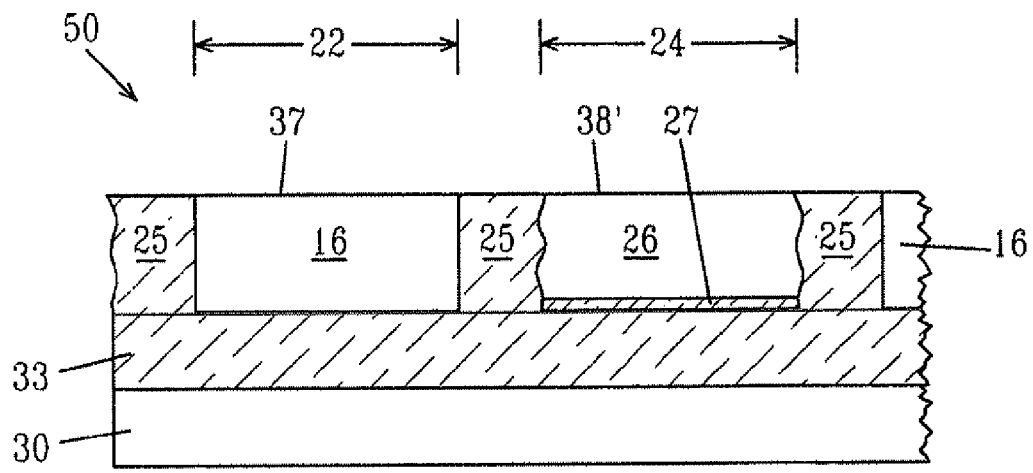

Referring to FIG. 11, and in a next process step, the second thermal oxide layer 34 and the first planarization stop layer 18 are removed using a selective etch process, wherein the resulting structure comprises a substantially planar SOI substrate 50 comprising a first device region 24 having a first crystallographic orientation and a second device region 22 having a second crystallographic orientation, the first crystallographic orientation being different from the second crystallographic orientation. The first device region 24 and the second device region 22 are separated by insulating material 25. Preferably, the first crystallographic orientation has a (110) crystal plane and the second crystallographic orientation has a (100) crystal plane.

Figure 12:
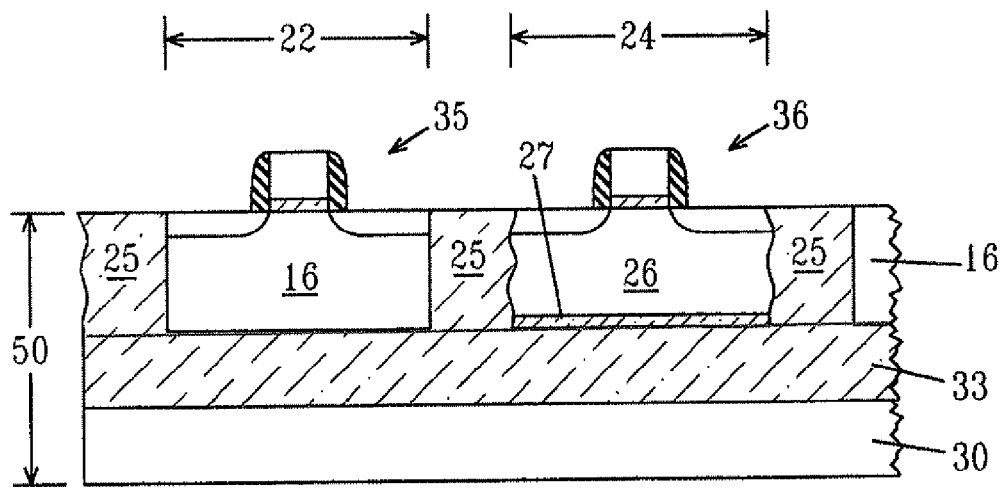
FIG. 12 is a pictorial representation (110)through cross sectional views) of nFET and pFET devices formed atop the optimized device regions of the inventive substantially planar SOI substrate.

The planar SOI substrate 50 may be further processed using conventional MOSFET processing steps to form at least one pFET device 36 in first device region 24 and at least one nFET device 35 in the second device region 22, as depicted in FIG. 12. It is noted that although FIG. 12 only depicts one pFET device 36 and only one nFET device 35, multiple nFET and pFET devices may also be formed on the inventive substrate 50 and are therefore within the scope of the present invention. The substantially planar SOI substrate 50 may also be processed using conventional fin MOSFET (FinFet) processing steps to make FinFets. In this case, the crystalline orientation of the first device region 24 and the second device region 22 for p-type and n-type FinFet devices may be different than the crystalline orientation of the first device region 24 and the second device region 22 for p-type and n-type planar MOSFET devices.

While the present invention has been particularly shown and described with respect to preferred embodiments thereof, it will be understood by those skilled in the art that the foregoing and other changes in forms and details may be made with departing from the spirit and scope of the present invention. It is therefore intended that the present invention not be limited to the exact forms and details described and illustrated, but fall within the scope of the appended claims.

What is claimed is:

1. A semiconducting structure comprising:
    a substantially planar SOI substrate comprising a first device region having a first crystallographic orientation semiconductor material and a second device region having a second crystallographic orientation semiconductor material, said first crystallographic orientation semiconductor material is different from said second crystallographic orientation semiconductor material, wherein an upper surface of the first device region and an upper surface of the second device region are coplanar, the substantially planar SOI substrate farther comprising a buried insulating layer underlying the first orientation semiconductor material and the second orientation semiconductor material, wherein a thermal oxide layer is present between the buried insulating layer and the second orientation semiconductor material; and
    an isolation region separating said first device region from said second device region.

2. The semiconducting structure of claim 1 wherein said first device region has a first device thickness and said second device region has a second device thickness, wherein said first device thickness is equal to said second device thickness or said first device thickness is different from said second device thickness.

3. The semiconducting structure of claim 1 wherein said first crystallographic orientation semiconductor material is in a (110) crystal plane and said second crystallographic orientation semiconductor material is in a (100) crystal plane.

4. The semiconducting structure of claim 3 wherein said first device region comprises a pFET and said second device region comprises an nFET.

5. The semiconducting structure of claim 1 wherein said first crystallographic orientation semiconductor material is in a (100) crystal plane and said second crystallographic orientation semiconductor material is in a (110) crystal plane.

6. The semiconducting structure of claim 5 wherein said first device region comprises an nFET and said second device region comprises a pFET.

7. An integrated circuit comprising:
 a substantially planar SOI substrate comprising a first device region having at least one nFET device and a second device region having at least one pFET device, wherein said nFET device is present on a surface having a (100) crystal plane semiconductor material and said pFET device is present on a surface having a (110) crystal plane semiconductor material, wherein an upper surface of the first device region and an upper surface of the second device region are coplanar, the substantially planar SOI substrate further comprising a buried insulating layer underlying the (100) crystal plane semiconductor material and the (110) crystal plane semiconductor material, wherein a thermal oxide layer is present between the buried insulating layer and the (110) crystal plane semiconductor material; and
 an isolation region separating said first device region from said second device region.

* * * * *